(12) United States Patent
Tanabe et al.

(10) Patent No.: US 8,609,304 B2
(45) Date of Patent: Dec. 17, 2013

(54) METHOD OF MANUFACTURING A TRANSFER MASK AND METHOD OF MANUFACTURING A SEMICONDUCTOR DEVICE

(75) Inventors: Masaru Tanabe, Tokyo (JP); Hideaki Mitsui, Tokyo (JP); Naoki Nishida, Tokyo (JP); Satoshi Iwashita, Tokyo (JP)

(73) Assignee: Hoya Corporation, Tokyo (JP)

( * ) Notice: Subject to any disclaimer, the term of this patent is extended or adjusted under 35 U.S.C. 154(b) by 81 days.

(21) Appl. No.: 13/436,132

(22) Filed: Mar. 30, 2012

(65) Prior Publication Data

US 2012/0251928 A1 Oct. 4, 2012

(30) Foreign Application Priority Data

Mar. 31, 2011 (JP) ................................ 2011-080203

(51) Int. Cl.
*G03F 1/50* (2012.01)
(52) U.S. Cl.
USPC .................................. 430/5; 430/30; 382/144

(58) Field of Classification Search
USPC .......................................... 430/5, 30; 382/144
See application file for complete search history.

(56) References Cited

FOREIGN PATENT DOCUMENTS

| JP | 2000-147748 A | 5/2000 |
| JP | 2007-086050 A | 4/2007 |
| JP | 2007-240517 A | 9/2007 |

*Primary Examiner* — Christopher Young
(74) *Attorney, Agent, or Firm* — Sughrue Mion, PLLC

(57) ABSTRACT

An internal defect or the like of a transfer mask is detected using transmitted light quantity distribution data of an inspection apparatus. Using a die-to-die comparison inspection method, inspection light is irradiated to a first region of a thin film to obtain a first transmitted light quantity distribution, the inspection light is also irradiated to a second region of the thin film to obtain a second transmitted light quantity distribution, a predetermined-range difference distribution is produced by plotting coordinates at which difference light quantity values calculated from a comparison between the first transmitted light quantity distribution and the second transmitted light quantity distribution are each not less than a first threshold value and less than a second threshold value, and a selection is made of a transfer mask in which a region with high density of plotting is not detected in the predetermined-range difference distribution.

22 Claims, 3 Drawing Sheets

METHOD OF MANUFACTURING A TRANSFER MASK AND METHOD OF MANUFACTURING A SEMICONDUCTOR DEVICE

This application is based upon and claims the benefit of priority from Japanese Patent Application No. 2011-080203, filed Mar. 31, 2011, the disclosure of which is incorporated herein in its entirety by reference.

BACKGROUND OF THE INVENTION

This invention relates to a method of manufacturing a transfer mask having, on a transparent substrate, a thin film formed with a transfer pattern and further relates to a method of manufacturing a semiconductor device using this transfer mask.

A transfer mask (photomask) is used for forming a substrate pattern on a semiconductor substrate (wafer) or the like in the manufacture of a semiconductor element or a liquid crystal display. The substrate pattern is formed by photolithography, i.e. by transmitting exposure light from a light source through the transfer mask to transfer a mask pattern of the transfer mask to an object (e.g. a resist film on the semiconductor wafer), then developing the object, and then carrying out etching using the developed object. The transfer mask is obtained, for example, by forming the mask pattern in a mask blank having a chromium light-shielding thin film or a light-semitransmitting (halftone) thin film on a transparent substrate such as a quartz glass substrate.

In general, a transfer mask is subjected to the occurrence of a defect in the manufacture thereof. The defect is, for example, in a pattern, an abnormal projection, abnormal lack, pinhole, scratch, semitransparent defect, size defect, position offset, lost pattern, abnormal gap between adjacent patterns, bridge, abnormal dot, or adhesion of foreign matter. Among them, the extra portion such as the abnormal projection, the abnormal dot, or the bridge is called a black defect and is removed, for example, using a laser, while the lacking portion such as the abnormal lack or the lost pattern is called a white defect and is corrected, for example, by forming a deposited film with high light-shielding property in the defect portion using laser CVD (chemical vapor deposition). When the white defect is corrected in a halftone portion of a halftone mask, the transmittance of a deposited film is controlled to a predetermined halftone value.

The defect is inspected using a transfer mask inspection apparatus. For example, the inspection apparatus emits light from a light source disposed on one side of a transfer mask, detects the intensities of transmitted light beams through a pattern of the transfer mask by a detection section such as an image sensor disposed on the other side of the transfer mask, and converts them into transmitted light quantity distribution data (collective data of position coordinates and transmitted light quantity values).

In general, in order to inspect whether or not there is a defect in a mask pattern of a transfer mask, a die-to-die comparison inspection method or a die-to-database comparison inspection method is used.

The die-to-die comparison inspection method compares the detection results of the transmitted light quantities through two real patterns of the same shape which are disposed at different positions of a transfer mask. For example, using the above-mentioned inspection apparatus, transmitted light beams through the two real patterns of the same shape disposed at the different positions of the transfer mask are detected and converted into data of transmitted light quantity distributions for the two real patterns. Then, these transmitted light quantity distribution data of the two real patterns are compared with each other by a control circuit or the like to record coordinates of inconsistent portions and differences not less than a threshold value, thereby detecting the position and size of a defect in the mask pattern.

On the other hand, the die-to-database comparison inspection method makes a comparison between a design pattern stored in a database and the detection result of the transmitted light quantities through a real pattern formed on a transfer mask. For example, from data of the design pattern stored in the database, transmitted light quantity distribution data of a comparative mask pattern is produced by simulation assuming that a real pattern with no defect is formed on a transfer mask. Then, the transmitted light quantity distribution data of the comparative mask pattern and transmitted light quantity distribution data obtained by detecting transmitted light beams through the real pattern of the transfer mask are compared with each other by a control unit or the like to record coordinates of inconsistent portions and differences not less than a threshold value, thereby detecting the position and size of a defect in the mask pattern.

In the case of a mask pattern in which a halftone pattern portion and a light-shielding pattern portion are provided on a transparent substrate (glass substrate) and a region other than those pattern portions serves as a light-transmitting pattern portion where the transparent substrate is exposed almost as it is, there is a case where white and black defects are present in the mask pattern. In this case, with respect to the white or black defect in the light-shielding pattern portion, when the mask pattern is inspected by the above-mentioned inspection method, since the amplitude from a difference data reference value at a defect data position is large (the magnitude of decrease or increase in transmitted light quantity from the difference data reference value is large), it is possible to set a threshold value away from the difference data reference value and thus detection is easy.

On the other hand, with respect to the white or black defect in the halftone pattern portion, since the amplitude from a difference data reference value at a defect data position is small, it is necessary to set a threshold value close to the difference data reference value. However, since data has noise, if the threshold value is set close to the difference data reference value, when the level of the noise is high, a portion, which is not a defect, may be erroneously detected as a defect. For this reason, the threshold value cannot be set close to the difference data reference value. In order to accurately detect a defect even in such a halftone pattern portion, it is proposed to amplify difference data of the halftone pattern portion to a level equivalent to that of difference data of the light-shielding pattern portion (see, e.g. JP-A-2007-240517 (Patent Document 1)).

It is also known that an internal defect (optically nonuniform portion) that affects exposure light in the use of a transfer mask is possibly present in a transparent substrate (glass substrate) which is used as a substrate of the transfer mask. In recent years, the wavelength of exposure light for use in photolithography has been shortened so that ArF excimer laser light has been used more frequently. Under these circumstances, it has been found that there is a case where an internal defect of the type that does not cause a local reduction in transmittance with respect to light having a wavelength longer than 200 nm, such as KrF excimer laser light, but causes a local reduction in transmittance with respect to light having a wavelength of 200 nm or less, such as ArF excimer laser light, is present in a transparent substrate. An internal defect inspection for detecting such an internal defect present in the transparent substrate is often carried out before forming a thin film on the transparent substrate. In JP-A-2007-86050 (Patent Document 2), a transparent substrate is inspected for the presence or absence of an internal defect by irradiating inspection light having a wavelength of 200 nm or less to the transparent substrate and detecting light having a wavelength longer than that of the inspection light from the transparent substrate.

SUMMARY OF THE INVENTION

In order to obtain a transfer mask, it is necessary to carry out many processes such as processes for manufacturing a mask blank by forming a thin film on a transparent substrate and processes for manufacturing a transfer mask by forming a transfer pattern in the thin film of the mask blank. Accordingly, there may be a possibility that after the transparent substrate before the formation of the thin film is inspected for the presence or absence of an internal defect, an internal defect is newly generated in those processes described above. On the other hand, if the transparent substrate having an internal defect is erroneously judged to be satisfactory in an internal defect inspection and is then thrown into the mask blank manufacturing processes, it is difficult to detect the internal defect in the mask blank manufacturing processes or the subsequent transfer mask manufacturing processes.

As described before, after forming the transfer pattern (mask pattern) in the thin film of the mask blank, the mask pattern of the transfer mask is inspected. In recent years, light having a wavelength of 200 nm or less has started to be used as inspection light of a transfer mask inspection apparatus. Since the transfer mask inspection apparatus inspects whether or not the mask pattern is formed as designed in the thin film, it is necessary to obtain a transmitted light quantity distribution by irradiating inspection light to one of main surfaces of the transfer mask and receiving transmitted light through the other main surface of the transfer mask. Normally, in the obtained transmitted light quantity distribution, the transmittance is high in a light-transmitting portion formed with no mask pattern, while the transmittance is low in a light-shielding portion formed with the mask pattern. Since a reduction in transmittance that occurs when an internal defect is present in the transparent substrate is normally smaller than a reduction in transmittance in the light-shielding portion, it seems possible to identify the internal defect. However, since the ease of transmission of the inspection light changes depending on the width of the light-transmitting portion, the transmittance changes even between the light-transmitting portions. Thus, it is difficult to identify the internal defect only based on the transmittance distribution, i.e. the transmitted light quantity distribution.

There is a possibility that the transfer mask inspection apparatus can detect an internal defect of a transparent substrate by inspecting the presence or absence of a defect of a mask pattern based on a comparison between two transmittance distributions, i.e. by the die-to-die comparison inspection method or the die-to-database comparison inspection method. The die-to-die comparison inspection method is an inspection method that obtains transmittance distributions for two mask patterns of the same shape (other than the presence or absence of a black defect or a white defect) formed on a transfer mask and compares the obtained two transmittance distributions. Since both mask patterns are the same, the difference in transmittance due to the difference in the width of light-transmitting portions does not theoretically occur between the two transmittance distributions. Accordingly, it seems possible to discover an internal defect if it is present in a transparent substrate right under one of the mask patterns.

However, when measuring the two mask patterns, it is difficult to set conditions of a light source of inspection light, an illumination optical system, and a receiving optical system to be totally the same and it is also difficult to set surface reflectances of the two mask patterns and changes in transmittance due to surface roughening of the substrate at its light-transmitting portions, the surface roughening being possibly caused in the pattern formation on the substrate, to be totally the same. As a consequence, it often occurs that high transmittance portions and low transmittance portions differ between the two transmittance distributions. Accordingly, if the two transmittance distributions are compared as they are, the probability is high to erroneously judge the presence of a defect even if there is no black or white defect in either of the two mask patterns. In view of this, the transfer mask inspection apparatus normally has a function of performing overall correction of transmittance distribution, i.e. transmitted light quantity distribution. In the case of the die-to-die comparison inspection method, it is often the case where a transmittance distribution of one of mask patterns is corrected with reference to a transmittance distribution of the other mask pattern. On the other hand, in the case of the die-to-database comparison inspection method, a transmittance distribution calculated by simulation is corrected with reference to a transmittance distribution of a real mask pattern.

However, the function of performing such correction for the transmittance distribution of the mask pattern works in a direction to make it difficult to detect an internal defect of a transparent substrate. While the width of a transfer pattern formed in a thin film of a transfer mask is on the order of a hundred nanometers, the internal defect of the transparent substrate is as extremely large as on the order of tens to hundreds of micrometers and thus a region where the transmitted light quantity decreases is large, so that the transfer mask inspection apparatus corrects the transmitted light quantity distribution without recognizing it as a defect. For this reason, it is difficult to detect the internal defect of the transparent substrate using the transfer mask inspection apparatus.

Also in the case where foreign matter adheres to a main surface, on the side (back side) opposite to a main surface where the thin film having the transfer pattern is formed, of the transparent substrate, if the size of the foreign matter is as extremely large as on the order of tens to hundreds of micrometers, the transmitted light quantity decreases in a large region as in the case of the internal defect and thus it is likewise difficult to detect the foreign matter defect. In the transfer mask, a pellicle is normally attached to the thin film having the transfer pattern for protecting the transfer pattern from adhesion of foreign matter or the like. Also in the case where the transfer mask attached with the pellicle is inspected using the transfer mask inspection apparatus, when foreign matter adheres to a surface of a membrane in the pellicle, if the size of the foreign matter is as extremely large as on the order of tens to hundreds of micrometers, the transmitted light quantity decreases in a large region as in the case of the internal defect and thus it is likewise difficult to detect the foreign matter defect.

It is therefore an object of this invention to solve the above-mentioned problems and thus to provide a method of manufacturing a transfer mask with no defect by detecting, in addition to a conventionally detectable defect present in a mask pattern, an internal defect of a transparent substrate, a foreign matter defect adhering to a main surface, on the side opposite to a main surface where a thin film is formed, of the transparent substrate, and a foreign matter defect adhering to a surface of a membrane in a pellicle attached to the thin film, using transmitted light quantity distribution data which is output in an inspection of the mask pattern from an inspection apparatus having a function of performing overall correction of transmitted light quantity distribution. It is another object of this invention to provide a method of manufacturing a semiconductor device with no defect in its circuit pattern, using such a transfer mask with no defect.

(1) In order to solve the above-mentioned problems, according to a first aspect of this invention, there is provided a method of manufacturing a transfer mask having on a transparent substrate a thin film formed with a transfer pattern, wherein the transfer pattern includes two patterns which are respectively formed in a first region and a second region based on the same design mask pattern, and wherein the method comprises:

a step of irradiating inspection light to the first region to obtain a first transmitted light quantity distribution;

a step of irradiating the inspection light to the second region to obtain a second transmitted light quantity distribution;

a step of producing a predetermined-range difference distribution by plotting coordinates at which a difference light quantity value calculated from a comparison between the first transmitted light quantity distribution and the second transmitted light quantity distribution is not less than a first threshold value and less than a second threshold value; and a step of selecting the transfer mask in which a region with high density of plotting is not detected in the predetermined-range difference distribution.

According to this manufacturing method, using an inspection apparatus adapted to inspect a transfer mask by the die-to-die comparison inspection method, first and second transmitted light quantity distributions are obtained from mask patterns of the same design formed in first and second regions and difference light quantity values are calculated by a comparison between the first and second transmitted light quantity distributions. Herein, each of the first and second transmitted light quantity distributions is collective data of position coordinates and transmitted light quantity values. Then, a predetermined-range difference distribution is produced by plotting coordinates at which the difference light quantity values are each not less than a first threshold value and less than a second threshold value. At the plotted coordinates, the difference light quantity value is, for example, greater than noise which is excluded by the first threshold value and is, for example, smaller than a conventionally detectable defect present in a mask pattern, such as a black defect which occurs in a light-transmitting pattern portion and is excluded by the second threshold value. Further, a region with high density of plots of the difference light quantity values is judged as an internal defect region and a selection is made of a transfer mask which does not include such an internal defect region. As a consequence, according to this manufacturing method, it is possible to provide a transfer mask with no defect by detecting, in addition to a conventionally detectable defect present in a mask pattern, an internal defect of a transparent substrate, a foreign matter defect adhering to a main surface, on the side opposite to a main surface where a thin film is formed, of the transparent substrate, and a foreign matter defect adhering to a surface of a pellicle attached to the thin film (hereinafter, the above-mentioned internal defect and foreign matter defects will be collectively referred to as an "internal defect or the like"), using transmitted light quantity distribution data which is output in an inspection of the mask pattern from the transfer mask inspection apparatus.

In the transmitted light quantity distribution data which is output in an inspection of the mask pattern from the transfer mask inspection apparatus, noises that occur randomly are generally included. Those noises that occur randomly and are included in the transmitted light quantity distribution data of a normal region are corrected so that the number of noises per unit area (occurrence density) becomes substantially the same in any imaging regions. However, according to an observation by the present inventor, if an internal defect or the like is present in one of the transmitted light quantity distributions to be compared by the die-to-die comparison inspection method, plots between the first and second threshold values are locally concentrated in a region, where the internal defect or the like is present, in the predetermined-range difference distribution.

(2) In order to solve the above-mentioned problems, according to a second aspect of this invention, there is provided a method of manufacturing a transfer mask having on a transparent substrate a thin film formed with a transfer pattern, wherein the transfer pattern includes a pattern which is formed in a predetermined region based on a design mask pattern, and wherein the method comprises:

a step of irradiating inspection light to the predetermined region to obtain a first transmitted light quantity distribution;

a step of calculating, by simulation, a second transmitted light quantity distribution which should be obtained when the inspection light is irradiated to a thin film formed with a transfer pattern based on the design mask pattern;

a step of producing a predetermined-range difference distribution by plotting coordinates at which a difference light quantity value calculated from a comparison between the first transmitted light quantity distribution and the second transmitted light quantity distribution is not less than a first threshold value and less than a second threshold value; and a step of selecting the transfer mask in which a region with high density of plotting is not detected in the predetermined-range difference distribution.

According to this manufacturing method, using an inspection apparatus adapted to inspect a transfer mask by the die-to-database comparison inspection method, a first transmitted light quantity distribution is obtained from a mask pattern of a predetermined region and, based on data of a design pattern for forming the mask pattern of the predetermined region, a second transmitted light quantity distribution of a comparative mask pattern is produced, and then, difference light quantity values are calculated by a comparison between the first and second transmitted light quantity distributions. Then, a predetermined-range difference distribution is produced by plotting coordinates at which the difference light quantity values are each not less than a first threshold value and less than a second threshold value. At the plotted coordinates, the difference light quantity value is, for example, greater than noise which is excluded by the first threshold value and is, for example, smaller than a conventionally detectable defect which is present in a mask pattern in a light-transmitting pattern portion and is excluded by the second threshold value. Further, a region with high density of plots of the difference light quantity values is judged as an internal defect region and a selection is made of a transfer mask which does not include such an internal defect region. As a consequence, according to this manufacturing method, it is possible to provide a transfer mask with no defect by detecting an internal defect or the like of the transfer mask in addition to a conventionally detectable defect present in a mask pattern, using transmitted light quantity distribution data which is output in an inspection of the mask pattern from the transfer mask inspection apparatus.

(3) In order to solve the above-mentioned problems, according to a third aspect of this invention, the first threshold value is a lower limit of a difference light quantity value for use in judging the presence or absence of an internal defect of the transparent substrate, the presence or absence of a foreign matter defect adhering to a main surface, on a side opposite to a main surface where the thin film is formed, of the transparent substrate, or the presence or absence of a foreign matter defect adhering to a surface of (a membrane in) a pellicle attached to the thin film.

According to this aspect, the first threshold value is set to, for example, the maximum level of a difference light quantity value of noise, thereby distinguishing between the noise level and a level of a difference light quantity value of an internal defect or the like which is not less than the first threshold value. As a consequence, in the transfer mask, it is possible to distinguish between coordinates in a region where a difference light quantity value of only noise, which occurs without the presence of an internal defect or the like, is present, and coordinates in a region where a difference light quantity value of an internal defect or the like is present.

(4) In order to solve the above-mentioned problems, according to a fourth aspect of this invention, the second threshold value is a lower limit of a difference light quantity value for use in judging the presence or absence of a defect due to the transfer pattern.

According to this aspect, the second threshold value is set to, for example, the minimum level of a difference light quantity value of a conventionally detectable defect in a light-transmitting pattern portion, thereby distinguishing between the conventionally detectable defect level and a level of a difference light quantity value of an internal defect or the like which is less than the second threshold value. As a consequence, in the transfer mask, it is possible to distinguish between coordinates in a region where a difference light quantity value of a conventionally detectable defect in a light-transmitting pattern portion is present, and coordinates in a region where a difference light quantity value of an internal defect or the like is present.

(5) In order to solve the above-mentioned problems, according to a fifth aspect of this invention, the step of selecting the transfer mask divides the predetermined-range difference distribution into a plurality of small regions, calculates a density of plotting in each small region, and compares the densities of plotting in the small regions to detect the region with high density of plotting.

According to this aspect, a region of the predetermined-range difference distribution, where the coordinates at which the difference light quantity values are between the first and second threshold values are plotted, is, for example, divided into a plurality of small regions of the same area smaller than the predetermined-range difference distribution region. Then, the density of plots is calculated per small region from the number of plots in each small region in the predetermined-range difference distribution. As a consequence, by judging per small region that the small region with high plot density is a region where an internal defect or the like is present and by totalizing those small regions, judged as the regions with the presence of the internal defect or the like, using the coordinates, it is possible to detect a region where the internal defect or the like is present.

(6) In order to solve the above-mentioned problems, according to a sixth aspect of this invention, the step of selecting the transfer mask judges that there is the region with high density of plotting when there is the small region in which the density of plotting is twice or more that in the other small region.

According to this aspect, when judging the region in which the plot density calculated per small region is high, a comparison is made between the plot density of one small region and the plot density of another small region. Then, if the plot density of one of the small regions is twice or more that of the other small region, the small region with the twice or more density is judged as a region with high plot density. As a consequence, even if the plot density of each small region is a relatively small value, the possibility is high that the difference between the value and the value twice the former value is significant. Therefore, it is possible to easily identify a region with high plot density and thus to detect the region where an internal defect or the like is present.

(7) In order to solve the above-mentioned problems, according to a seventh aspect of this invention, the step of selecting the transfer mask displays the predetermined-range difference distribution in image display means and detects by visual recognition the region with high density of plotting.

According to this aspect, in the step of selecting the transfer mask, there is provided image display means that can display the predetermined-range difference distribution output from the inspection apparatus or an information processing apparatus connected to the inspection apparatus. That is, the image display means displays the predetermined-range difference distribution to allow an inspector or an operator to visually confirm it. As a consequence, it is possible to confirm the plot density based detection using the inspection apparatus or the information processing apparatus and, further, it is also possible to visually identify, by an experienced inspector or the like, a region of a delicate internal defect or the like which cannot be judged by the inspection apparatus or the like, or a region of a complicated internal defect or the like which is difficult to judge.

(8) In order to solve the above-mentioned problems, according to an eighth aspect of this invention, the inspection light has a wavelength of 200 nm or less.

According to this aspect, in the transfer mask inspection apparatus, the wavelength of transmitted light generated from a light source for use in an inspection is set to 200 nm or less. When a comparison is made between the case of transmitted light having a wavelength longer than 200 nm and the case of transmitted light having a wavelength of 200 nm or less, the rate of emission of fluorescent light by an internal defect or the like increases in the case of 200 nm or less. As a consequence, by carrying out an inspection using the inspection apparatus in which the wavelength of inspection light is set to 200 nm or less, it is possible to enhance the accuracy of visual detection of a region having an internal defect or the like.

(9) In order to solve the above-mentioned problems, according to a ninth aspect of this invention, the first threshold value is a difference light quantity value at which a transmittance difference calculated by dividing the difference light quantity value by a light quantity of the inspection light becomes 2%.

According to this aspect, in the transfer mask inspection apparatus, the transmittance difference being the ratio of a difference light quantity value to the light quantity of inspection light emitted from a light source is calculated and the difference light quantity value at which the transmittance difference is 2% is set as the first threshold value. This difference light quantity value at which the transmittance difference is 2% is a value determined by the results of tests and studies by the present inventor. This value is considered to be the maximum of a difference light quantity value of noise as described above or, conversely, it is the minimum of a difference light quantity value of an internal defect or the like. As a consequence, by setting the first threshold value to the difference light quantity value at which the transmittance difference becomes 2% when judging the presence or absence of an internal defect or the like of the transfer mask, it is possible to well distinguish between the noise and the internal defect or the like.

When the change in light quantity of the inspection light is small, the transmittance difference may be the ratio of the light intensity of the transmitted light to the light intensity of the inspection light emitted from the light source.

(10) In order to solve the above-mentioned problems, according to a tenth aspect of this invention, the second threshold value is a difference light quantity value at which a transmittance difference calculated by dividing the difference light quantity value by a light quantity of the inspection light becomes 40%.

According to this aspect, in the transfer mask inspection apparatus, the transmittance difference being the ratio of a difference light quantity value to the light quantity of inspection light emitted from a light source is calculated and the difference light quantity value at which the transmittance difference is 40% is set as the second threshold value. This difference light quantity value at which the transmittance difference is 40% is also a value determined by the results of tests and studies by the present inventor. This value is considered to be the minimum of a difference light quantity value of a conventionally detectable defect in a light-transmitting pattern portion as described above or, conversely, it is the maximum of a difference light quantity value of an internal defect or the like. As a consequence, by setting the second threshold value to the difference light quantity value at which the transmittance difference becomes 40% when judging the presence or absence of an internal defect or the like of the transfer mask, it is possible to well distinguish between the conventionally detectable defect of the mask pattern in the light-transmitting pattern portion and the internal defect or the like.

Also in this case, when the change in light quantity of the inspection light is small, the transmittance difference may be the ratio of the light intensity of the transmitted light to the light intensity of the inspection light emitted from the light source.

(11) In order to solve the above-mentioned problems, according to an eleventh aspect of this invention, the method comprises carrying out overall correction of light quantity distribution for the first transmitted light quantity distribution or the second transmitted light quantity distribution and calculating the difference light quantity value using the corrected light quantity distribution.

According to this aspect, in the transfer mask inspection apparatus, overall correction is carried out for the first transmitted light quantity distribution detected from the first region or the second transmitted light quantity distribution detected from the second region. As a consequence, it is possible to obtain light quantity distributions in the case where the same light source light quantity is supplied to the first and second transmitted light quantity distributions, and thus to calculate difference light quantity values from the light quantity distributions in the case where the same light source light quantity is supplied.

(12) In order to solve the above-mentioned problems, according to a twelfth aspect of this invention, there is provided a method of manufacturing a semiconductor device, comprising forming a circuit pattern on a semiconductor wafer using the transfer mask manufactured by the method according to any one of the first through the eleventh aspects of this invention.

According to this aspect, since the transfer mask manufactured by the method according to any one of the above-mentioned aspects (1) to (11) is used, the yield is not reduced even when forming a circuit pattern on a semiconductor wafer by photolithography. This is particularly effective when forming a circuit pattern on a semiconductor wafer by photolithography using laser exposure light having a wavelength of 200 nm or less.

According to this invention, it is possible to provide a method of manufacturing a transfer mask with no defect by detecting, in addition to a conventionally detectable defect of a mask pattern, an internal defect of a transparent substrate, a foreign matter defect adhering to a main surface, on the side opposite to a main surface where a thin film is formed, of the transparent substrate, and a foreign matter defect adhering to a surface of a pellicle attached to the thin film, using transmitted light quantity distribution data which is output in an inspection of the mask pattern from an inspection apparatus having a function of performing overall correction of transmitted light quantity distribution.

DESCRIPTION OF THE EMBODIMENT

Figure 1:
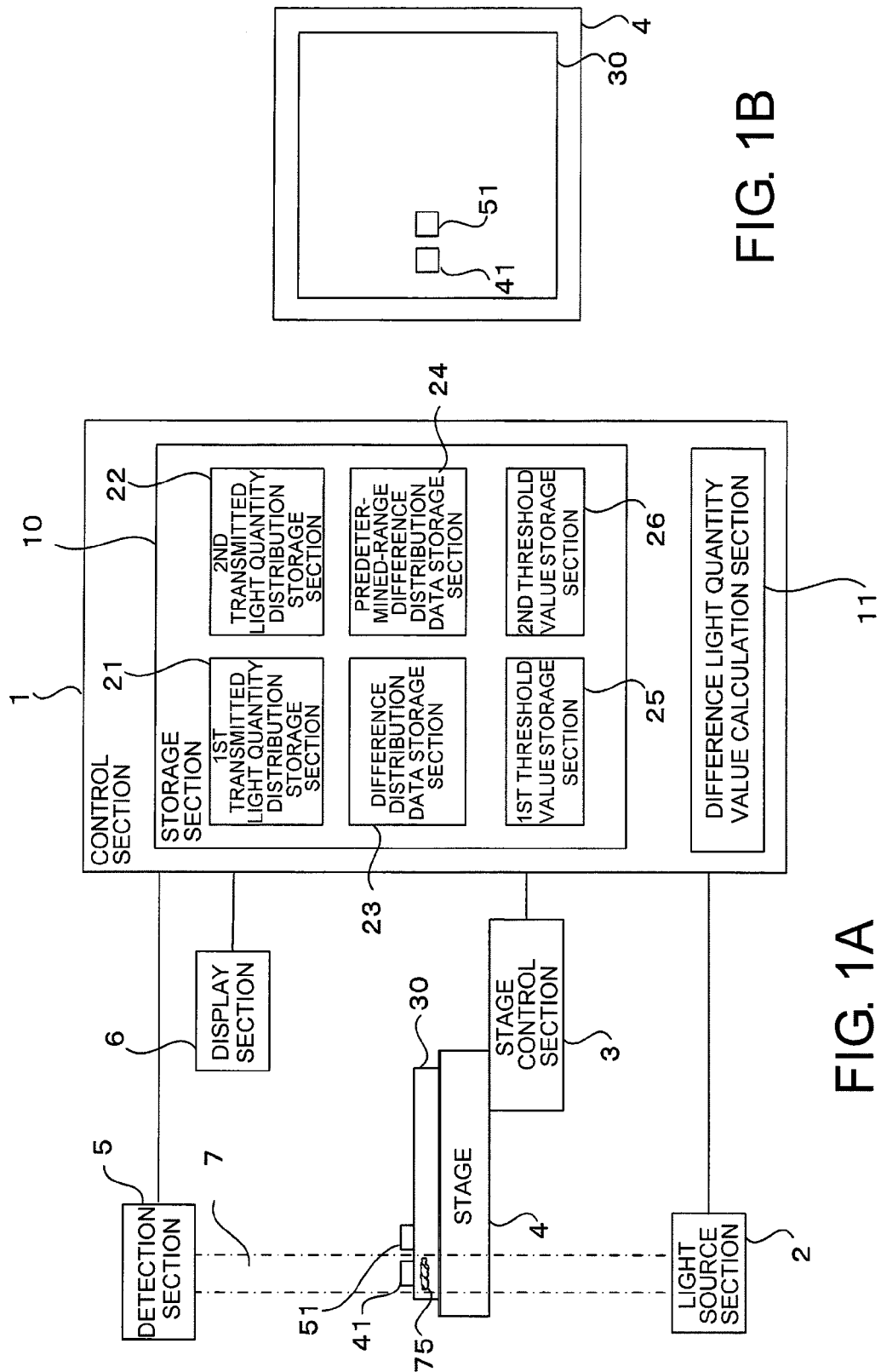
FIG. 1A is a block diagram showing a schematic internal structure of a defect inspection apparatus of an embodiment in a transfer mask manufacturing method according to this invention.
FIG. 1B is a top view showing an example of a transfer mask which is inspected by the defect inspection apparatus shown in FIG. 1A.

Referring to FIGS. 1A and 1B, according to an embodiment of this invention, an inspection apparatus for a transfer mask 30 comprises a light source section 2 for emitting laser light, a stage 4, a detection section 5, and a control section 1 and senses or detects an internal defect 75 (optically nonuniform region that causes a local change in optical properties in pattern transfer). Although a method of detecting the presence or absence of an internal defect of a transparent substrate will be described hereinbelow, detection of the presence or absence of a foreign matter defect adhering to a main surface, on the side opposite to a main surface where a thin film is formed, of the transparent substrate and detection of the presence or absence of a foreign matter defect adhering to a surface of a pellicle attached to the thin film can also be carried out by the same method.

The control section 1 controls the entire inspection apparatus and is also a detection means which is connected to the detection section 5 through a communication cable for detecting various defects based on input transmitted light quantity distributions. The control section 1 stores a transmitted light quantity distribution, input from the detection section 5, into a storage circuit. In this event, for example, transmitted light quantity values at coordinates in a first region 41, where a transfer pattern having a light-transmitting portion and a light-shielding portion is formed, of the thin film are stored as a first transmitted light quantity distribution in a first transmitted light quantity distribution storage section 21 in a storage section 10.

Thereafter, the control section 1 moves the stage 4 using a stage control section 3 so that, for example, transmitted light quantity values at coordinates in a second region 51, where the same transfer pattern as that of the first region 41 on a design basis is formed, of the thin film are stored as a second transmitted light quantity distribution in a second transmitted light quantity distribution storage section 22 in the storage section 10. Herein, in the case where the transfer mask 30 has the internal defect 75 in the first region 41, a reduction in transmitted light quantity occurs in the entirety or a large part of the first region 41.

Figure 2:
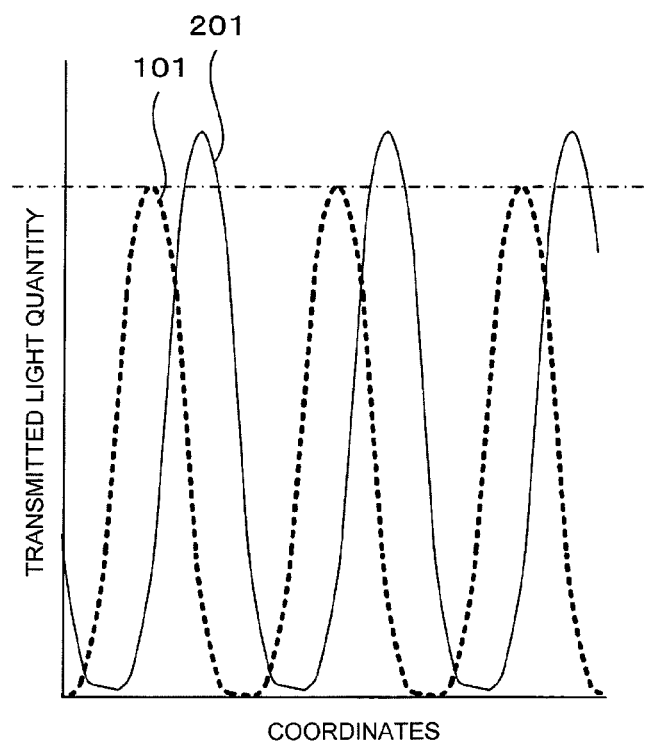
FIG. 2 is a graph for explaining this invention, wherein there are shown first and second transmitted light quantity distributions before carrying out coordinate correction and light quantity distribution correction.

Then, using a difference light quantity value calculation section 11, the control section 1 reads the first transmitted light quantity distribution of the first region 41 and the second transmitted light quantity distribution of the second region 51 from the first transmitted light quantity distribution storage section 21 and the second transmitted light quantity distribution storage section 22, respectively, and calculates differences between the first and second transmitted light quantity distributions, thereby producing difference distribution data. FIG. 2 is a graph showing first and second transmitted light quantity distributions which are placed in the same coordinate system as they are, wherein a design pattern is a line and space pattern and patterns based on the same design pattern are formed in first and second regions, respectively. The first and second transmitted light quantity distributions are each a distribution of transmitted light quantity values at respective points in a two-dimensional coordinate system. In FIG. 2, the first and second transmitted light quantity distributions of pertinent portions are respectively extracted in a one-dimensional rectilinear coordinate system in a direction perpendicular to a direction of the line and space pattern and are respectively expressed as transmittance distributions in a coordinate system with the abscissa representing the one-dimensional rectilinear coordinate position and the ordinate representing the transmitted light quantity. In FIG. 2, numeral 101 denotes the first transmitted light quantity distribution and numeral 201 denotes the second transmitted light quantity distribution.

As seen in FIG. 2, although the patterns are formed based on the same design pattern, the peaks on the high transmittance side (transmittance in space portion or light-transmitting portion) and the peaks on the low transmittance side (transmittance in line portion or light-shielding portion) of the first and second transmitted light quantity distributions 101 and 201 are shifted as a whole. This is because when obtaining the first and second transmittance distributions, the measurement is carried out by setting two-dimensional coordinates using, as reference points, reference marks such as alignment marks provided on the transfer mask, but still the position accuracy is insufficient. Accordingly, it is seen that coordinate correction (alignment correction) needs to be carried out. Further, in the first transmitted light quantity distribution 101 obtained in the first region of the transfer pattern present right above a region, where the internal defect 75 is present, of the transparent substrate, the peaks on the high transmittance side (transmittance in space portion or light-transmitting portion) is reduced by about 20% as a whole as compared with those in the second transmitted light quantity distribution 201 obtained in the second region of the transfer pattern present right above a region, where no internal defect is present, of the transparent substrate.

However, as described before, even if no internal defect is present in the transparent substrate right under either of the first and second regions, some surface roughening often occurs on the surface, being in contact with the thin film, of the transparent substrate due to etching or the like in the formation of the transfer pattern and the levels of the surface roughening may differ depending on places. Further, when obtaining the two transmitted light quantity distributions, it is difficult to set conditions of an inspection light source, an illumination optical system, and a receiving optical system to be totally the same. That is, it is difficult to avoid the occurrence of some difference between the first and second transmitted light quantity distributions 101 and 201. Since the primary object of the transfer mask inspection apparatus is to accurately detect a black or white defect, it should be avoided that the false detection rate becomes high. Accordingly, before calculating differences between the first and second transmitted light quantity distributions 101 and 201, it is necessary to correct at least one of the transmitted light quantity distributions. For the reasons described above, the control section 1, using the difference light quantity value calculation section 11, overlays the two transmitted light quantity distributions on the same two-dimensional coordinate system to carry out coordinate correction, further carries out light quantity distribution correction of at least one of the two transmitted light quantity distributions (in this example, the first and second transmitted light quantity distributions 101 and 201 are both corrected), and then calculates differences between the two transmitted light quantity distributions, thereby producing difference distribution data (predetermined-region difference distribution data). The produced difference distribution data is temporarily stored in a difference distribution data storage section 23 in the storage section 10.

Figure 3:
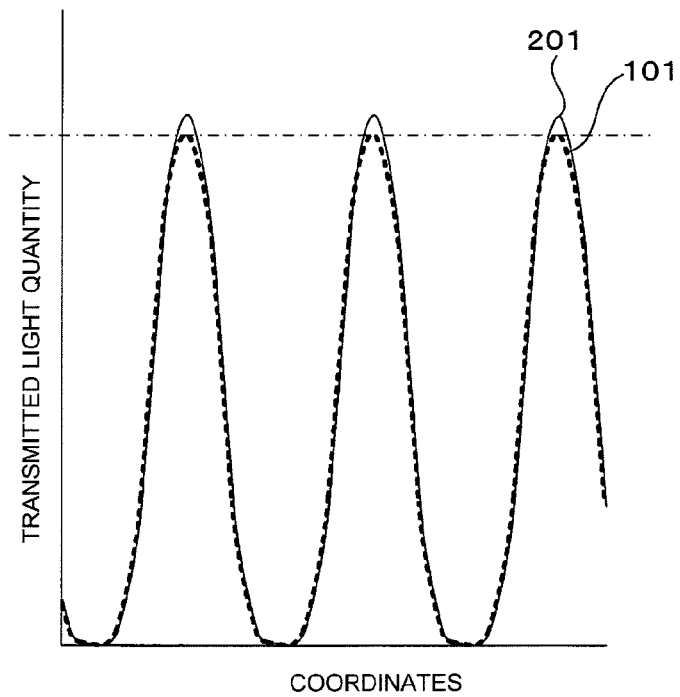
FIG. 3 is a graph for explaining this invention, wherein there are shown first and second transmitted light quantity distributions after carrying out coordinate correction and light quantity distribution correction.

FIG. 3 is a graph showing the first and second transmitted light quantity distributions 101 and 201 after being subjected to the coordinate correction and the light quantity distribution correction. As seen from FIG. 3, since the correction was carried out by the control section 1, the peak reduction as a whole on the high transmittance side, which occurred in the first transmitted light quantity distribution 101, has been reduced so that the difference between the first and second transmitted light quantity distributions 101 and 201 has become very small. As a consequence, it is difficult to detect the internal defect 75 of the transparent substrate by a normal transfer mask inspection method.

The transmitted light quantity distribution data stored in the respective transmitted light quantity distribution storage sections 21 and 22 and the difference distribution data stored in the difference distribution data storage section 23 can be displayed as images on a display section 6 connected to the control section 1. The display section 6 is, for example, a liquid crystal display device with high resolution.

Then, the control section 1 compares the difference distribution data temporarily stored in the difference distribution data storage section 23 with a first threshold value read from a first threshold value storage section 25 in the storage section 10 and with a second threshold value read from a second threshold value storage section 26 in the storage section 10 and stores those data not less than the first threshold value and less than the second threshold value (predetermined-range difference distribution data) into a predetermined-range difference distribution data storage section 24 in the storage section 10. The first and second threshold values are determined by a later-described method and are respectively stored in the first and second threshold value storage sections 25 and 26 in advance.

The light source section 2 is a light introducing means for introducing, from the lower side of the transfer mask 30 formed with the pattern on the transparent substrate (synthetic quartz glass substrate), inspection light 7 (transmitted light) in the form of ArF excimer laser light (wavelength $\lambda_1$: 193 nm) having the same wavelength as exposure light which is used in exposure and transfer to a resist film on a wafer. After the stage 4, which is movable in X, Y, and Z directions, moves the transfer mask 30 to a predetermined position, the light source section 2 introduces inspection light 7 from respective positions of the lower surface of the transfer mask 30. In this embodiment, the ArF excimer laser light is used as the exposure light to thereby detect an internal defect which causes a local reduction in transmittance with respect to exposure light having a wavelength of 200 nm or less. However, this invention is not limited thereto. It may alternatively be configured such that an internal defect which causes a local reduction in transmittance with respect to conventional exposure light having a wavelength longer than 200 nm is detected using inspection light (wavelength: 257 nm, 365 nm, 488 nm, or the like) having a wavelength longer than 200 nm (this also applies to detection of the presence or absence of a foreign matter defect adhering to the main surface, on the side opposite to the main surface where the thin film is formed, of the transparent substrate and detection of the presence or absence of a foreign matter defect adhering to the surface of the pellicle attached to the thin film).

The stage control section 3 is connected to the control section 1 so as to be controlled by the control section 1. The stage control section 3 can move the stage 4 in the X, Y, and Z directions so that the transfer mask 30 placed on the stage 4 as shown in FIG. 1A can be moved in the respective directions with respect to the laser light emitted from the light source section 2.

As shown in FIG. 1A, the detection section 5 is a light-receiving means which is disposed on the main surface side of the transfer mask 30 placed on the stage 4 and which comprises light-receiving elements and an objective lens for allowing transmitted light from an imaging object (transfer mask 30) to be incident on the light-receiving elements, thus being capable of detecting one of the pattern regions 41 and 51 of the transfer mask 30. The detection section 5 receives, from the main surface side of the transfer mask 30, for example, not only normally transmitted inspection light 7, but also transmitted inspection light 7 attenuated by noise in the light-transmitting pattern portion of the transfer mask 30 and transmitted inspection light 7 attenuated by the internal defect 75 or the like. The detection section 5 may also receive fluorescent light with a wavelength longer than the wavelength $\lambda_1$ generated by the internal defect 75 or the like. In this embodiment, the detection section 5 comprises the light-receiving elements that can receive ArF excimer laser light.

In this embodiment, CCD image sensors are used as the light-receiving elements. The CCD image sensors each photoelectrically convert the brightness of transmitted light of an image formed on a light-receiving surface of the detection section 5 into the amount of charge and the control section 1 sequentially reads the amounts of charge and converts them into electrical signals. Although the CCD image sensors are used as the light-receiving elements in the detection section 5 in this embodiment, this invention is not limited thereto. It is possible to optionally use other photosensors such as photoresistors.

Among internal defects 75 possibly present in the transfer mask 30, there is the type that does not raise any problem in the case of exposure light having a wavelength longer than 200 nm (e.g. KrF excimer laser light (wavelength: 248 nm)), but raises a problem in the case of exposure light having a wavelength of 200 nm or less (e.g. ArF excimer laser light (wavelength: 193.4 nm)).

The internal defect 75 of this type causes a local change in optical properties (e.g. reduction in transmittance or change in phase difference) when the thin film pattern of the transfer mask 30 is transferred to a transfer target using the exposure light having the wavelength of 200 nm or less, thereby adversely affecting the pattern transfer to degrade the transfer accuracy. Then finally, there occurs a transferred pattern defect, such as a circuit pattern defect, of a transfer target such as a semiconductor device.

The internal defect 75 occurs due to "local striation", "content", "heterogeneity", or the like. "heterogeneity" is an oxygen excessive region where oxygen is excessively incorporated in a synthetic quartz glass, and does not recover after irradiation of high energy light. "local striation" is a region where a very small amount of a metal element is incorporated in a synthetic quartz glass when producing the synthetic quartz glass. If the local striation is present in the synthetic quartz glass substrate of the transfer mask 30, the transmittance is reduced by about 5 to 30% in pattern transfer to degrade the transfer accuracy, resulting in the occurrence of a transferred pattern defect. "content" is a region where a metal element is incorporated in a synthetic quartz glass in an amount more than that in the case of the local striation. The internal defect 75 is not limited to "local striation", "content", or "heterogeneity".

Herein, a description will be given of a process (die-to-die comparison inspection method) for judging the presence or absence of a black or white defect of a transfer pattern, which is the primary object of the transfer mask inspection apparatus. The control section 1 reads the difference distribution data (the predetermined-region difference distribution data) stored in the difference distribution data storage section 23 and judges whether or not there is a difference, which is not less than the second threshold value, in the difference distribution data. Then, if there is such a difference, i.e. if there are coordinates where the difference value is not less than the second threshold value, the control section 1 judges that there is a black or white defect. Whether the defect is the black or white defect is synthetically judged, also taking into account the first and second transmitted light quantity distributions. In the case of the black or white defect, since it often happens that the same difference occurs over a plurality of coordinates, there is a case where judgment is made also taking into account differences at surrounding coordinates.

Figure 4:
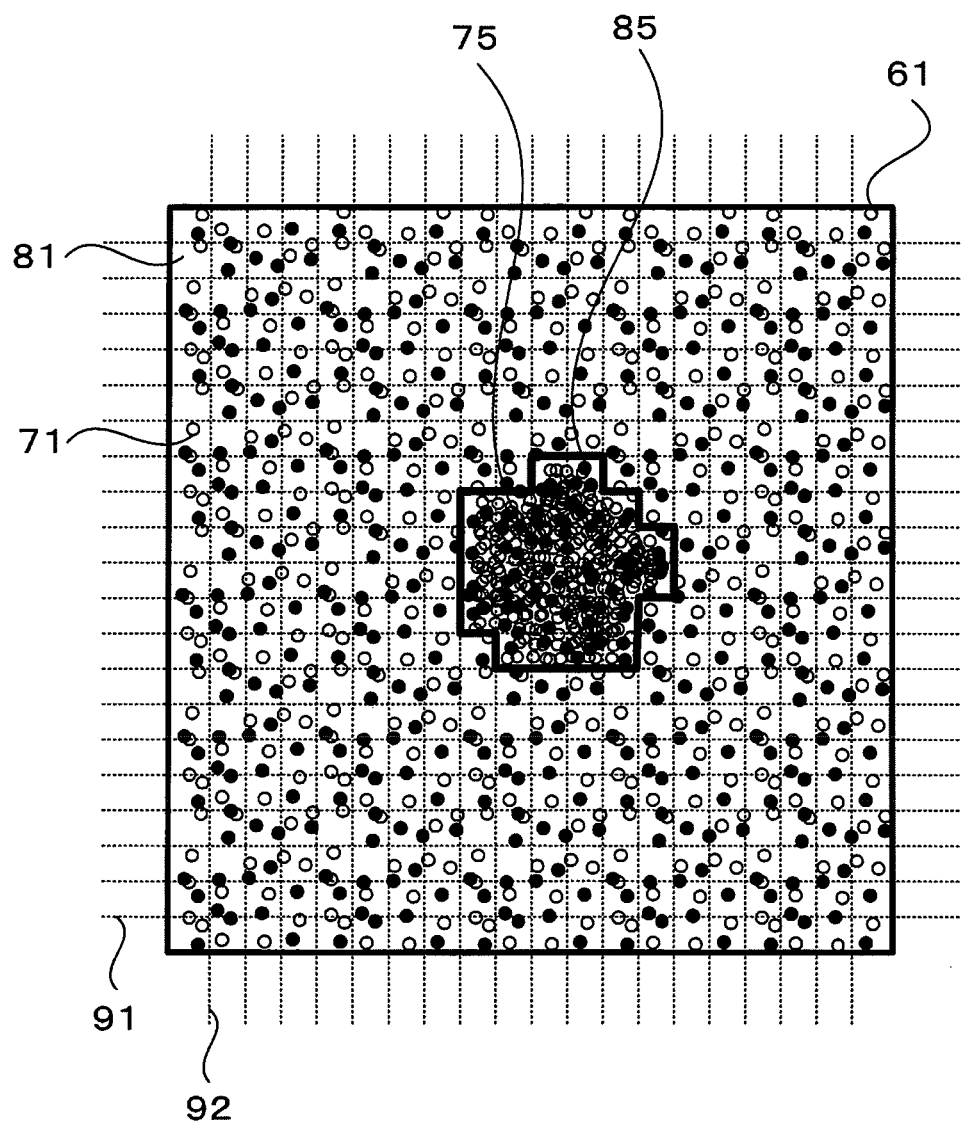
FIG. 4 is a diagram for explaining this invention, wherein there is shown an example of predetermined-range difference distribution data including noises and an internal defect or the like which affect the transmitted light quantity of light irradiated to a transfer mask.

Next, a process for judging the presence or absence of an internal defect 75 will be described. FIG. 4 is a diagram in which the difference distribution data (the predetermined-region difference distribution data) stored in the difference distribution data storage section 23 is shown as an image (difference distribution image 61) in a two-dimensional coordinate system. As described before, the predetermined-range difference distribution data stored in the predetermined-range difference distribution data storage section 24 is obtained from the difference distribution data stored in the difference distribution data storage section 23. As also described before, the difference distribution data stored in the difference distribution data storage section 23 is obtained from the first and second transmitted light quantity distributions after the correction. In the difference distribution image 61, there are shown noises 71 and an internal defect 75 in the form of an incorporated impurity or the like that attenuates transmitted light.

In the difference distribution image 61, only those coordinates having difference values, each of which is not less than the first threshold value stored in the first threshold value storage section 25 are plotted. As described before, the differences are calculated after carrying out the light quantity correction of the first and second transmitted light quantity distributions, but it is not possible to correct all light quantity differences due to noise only by the light quantity correction. If the first threshold value is not provided, many coordinates having very small difference values are also plotted so that it is difficult to judge whether the differences are caused by the internal defect 75 or noise. Therefore, the upper limit of differences in a range where a reduction in transmitted light quantity hardly affects exposure and transfer is set as the first threshold value so as to prevent those coordinates having differences due to noise from being plotted in the difference distribution image 61. If the first threshold value is set too large, a reduction in detection sensitivity for the internal defect 75 is caused. When the line edge roughness of a transfer pattern is poor, there occurs a difference due to a transfer pattern problem other than a black or white defect. If the first threshold value is set too large, there is a case where the line edge roughness cannot be judged.

When the difference light quantity is less than 2%, it is difficult to distinguish it from fluctuation in transmitted light quantity in the light-shielding pattern portion. On the other hand, the difference light quantity being 40% or more is a range which is used for detecting the occurrence of a black defect in the light-transmitting portion or the occurrence of a white defect in the light-shielding portion, so that it is not possible to distinguish between the black or white defect and the internal defect 75. Accordingly, in this embodiment, the first threshold value is set to 2%, the second threshold value is set to 40%, and the range therebetween is set as a predetermined range, and if the difference distribution data of the light-transmitting pattern portion is in the predetermined range (2% to 40%), it is judged that failure occurs in the light-transmitting pattern portion.

A region of the internal defect 75 shown in FIG. 4 attenuates inspection light 7 so that the light quantity detected by the detection section 5 is reduced.

In this embodiment, as shown in FIG. 4, an image region of the difference distribution image 61 of the transfer mask 30 is divided into a plurality of small regions 81 by longitudinal division lines 92 and lateral division lines 91. Each small region 81 has a size including a plurality of pixels in the image region. The small regions 81 are formed by dividing longitudinal and lateral sides of the image region each into several ten to several hundred parts by the lateral and longitudinal division lines 91 and 92, respectively. Among the small regions 81, those small regions 81 including the internal defect 75 form an internal defect block 85.

With the structure of the transfer mask inspection apparatus described above, when inspection light 7 is introduced into the transfer mask 30 under the control of the control section 1, if the internal defect 75 is present in the transfer mask 30, the inspection light 7 is attenuated by the internal defect 75 so that the transmittance is reduced by about 5 to 30%. Although the inspection light 7 is also attenuated by noise in a region, other than the internal defect 75, of the transfer mask 30, the attenuation amount is not so large as that caused by the internal defect 75.

The detection section 5 receives the normally transmitted inspection light 7 and the inspection light 7 attenuated by noise or the internal defect 75 and then the control section 1 calculates a transmitted light quantity (brightness) distribution from the received inspection light 7 and detects a defect based on the difference between the transmitted light quantity distributions of the same pattern at different positions by the die-to-die comparison inspection method and, in this embodiment, further detects the internal defect 75.

In the light-transmitting portion of the transfer mask 30 displayed in the display section 6, many noises 7 appear randomly. On the other hand, in the case where the internal defect 75 is present in the light-transmitting portion of the transfer mask 30, the transmitted light is attenuated by the internal defect 75 so that the transmitted light attenuation due to the defect is locally concentrated as different from the random occurrence of the noises 71.

In the manufacture of a transfer mask 30, when an internal defect block 85 as shown in FIG. 4 is present, the transfer mask 30 has an internal defect and thus should not be selected. A selection should only be made of a transfer mask 30 in which a region where the density of coordinate plots each having a difference light quantity value not less than the first threshold value and less than the second threshold value is high is not detected.

As described above, according to the manufacturing method of this embodiment, it is possible to provide a transfer mask 30 with no defect by detecting, in addition to a conventionally detectable defect of a mask pattern, an internal defect or the like of the transfer mask 30, using transmitted light quantity distribution data which is output in an inspection of the mask pattern from the inspection apparatus.

In the above-mentioned manufacturing method, the transfer mask 30 is inspected by the die-to-die comparison inspection method, but the die-to-database comparison inspection method may alternatively be used. In this case, a transfer pattern of a pattern forming thin film includes in its predetermined region a pattern which is formed based on a design mask pattern. First, a first transmitted light quantity distribution is obtained by irradiating inspection light 7 to the predetermined region of the pattern forming thin film. Then, a second transmitted light quantity distribution which should be obtained when inspection light 7 is irradiated to a pattern forming thin film formed with a transfer pattern based on the design mask pattern is calculated by simulation. Subsequent processes are the same as those in the die-to-die comparison inspection method.

Also in this case, it is possible to provide a transfer mask 30 with no defect by detecting, in addition to a conventionally detectable defect of a mask pattern, an internal defect or the like of the transfer mask 30, using transmitted light quantity distribution data which is output in an inspection of the mask pattern from the inspection apparatus.

When selecting a transfer mask 30 in this embodiment, if there is a small region 81 in which the density of plots is twice or more that in another small region 81, it is judged that there is a region with high plot density. As a consequence, even if the density of plots in each small region 81 is a relatively small value, the possibility is high that the difference between the value and the value twice the former value is significant. Therefore, it is possible to easily identify a region with high plot density and thus to detect the region where an internal defect or the like is present.

When selecting a transfer mask 30 in this embodiment, a difference distribution image 61 is displayed in the image display means (display section 6), thereby detecting by visual recognition a region with high plot density. As a consequence, it is possible to confirm the plot density based detection using the inspection apparatus or an information processing apparatus and, further, it is also possible to visually identify, by an experienced inspector or the like, a region where a delicate internal defect or the like which cannot be judged by the inspection apparatus or the like is present, or a region where a complicated internal defect or the like which is difficult to judge is present.

In this embodiment, the inspection light 7 has a wavelength of 200 nm or less. By carrying out an inspection using the inspection apparatus in which the wavelength of the inspection light 7 is set to 200 nm or less, it is possible to enhance the accuracy of visual detection of a region having an internal defect or the like.

In this embodiment, the first threshold value is a difference light quantity value at which the transmittance difference calculated by dividing the difference light quantity value by the light quantity of the inspection light 7 becomes 2%. In this manner, by setting the first threshold value to the difference light quantity value at which the transmittance difference becomes 2% when judging the presence or absence of an internal defect or the like of a transfer mask, it is possible to well distinguish between noise and the internal defect or the like.

In this embodiment, the second threshold value is a difference light quantity value at which the transmittance difference calculated by dividing the difference light quantity value by the light quantity of the inspection light 7 becomes 40%. In this manner, by setting the second threshold value to the difference light quantity value at which the transmittance difference becomes 40% when judging the presence or absence of an internal defect or the like of a transfer mask, it is possible to well distinguish between a conventionally detectable defect of a mask pattern in a light-transmitting pattern portion and the internal defect or the like.

In this embodiment, overall correction of light quantity distribution is carried out for at least one of the first and second transmitted light quantity distributions and difference light quantity values are calculated using the corrected light quantity distributions. As a consequence, it is possible to obtain light quantity distributions in the case where the same light source light quantity is supplied to the first and second transmitted light quantity distributions, and thus to calculate difference light quantity values from the light quantity distributions in the case where the same light source light quantity is supplied.

This invention is not limited to the above-mentioned embodiment of the manufacturing method of the transfer mask 30. If the transmitted light quantity per coordinate position can be measured in a plurality of portions, if the difference light quantities of the same portions can be obtained based on transmitted light quantities of the same design pattern, and if the difference light quantities can be compared with predetermined first and second threshold values, it is possible to apply this invention to a manufacturing method of a glass substrate alone, a manufacturing method of a halftone mask blank, and manufacturing methods of products using various other transparent substrates.

In FIGS. 1A, 1B, 2, 3, and 4,
1: control section
2: light source section
3: stage control section
4: stage
5: detection section
6: display section
7: inspection light
10: storage section
11: difference light quantity value calculation section
21: first transmitted light quantity distribution storage section
22: second transmitted light quantity distribution storage section
23: difference distribution data storage section
24: predetermined-range difference distribution data storage section
25: first threshold value storage section
26: second threshold value storage section
30: transfer mask
41: (thin film) first region
51: (thin film) second region
61: difference distribution image
71: noise
75: internal defect
85: internal defect block (including a plurality of regions)
91: lateral division line
92: longitudinal division line
101: first transmittance distribution
201: second transmittance distribution

What is claimed is:

1. A method of manufacturing a transfer mask having on a transparent substrate a thin film formed with a transfer pattern,
wherein the transfer pattern includes two patterns which are respectively formed in a first region and a second region based on the same design mask pattern, and
wherein the method comprises:
a step of irradiating inspection light to the first region to obtain a first transmitted light quantity distribution;
a step of irradiating the inspection light to the second region to obtain a second transmitted light quantity distribution;
a step of producing a predetermined-range difference distribution by plotting coordinates at which a difference light quantity value calculated from a comparison between the first transmitted light quantity distribution and the second transmitted light quantity distribution is not less than a first threshold value and less than a second threshold value; and
a step of selecting the transfer mask in which a region with high density of plotting is not detected in the predetermined-range difference distribution.

2. A method of manufacturing a transfer mask having on a transparent substrate a thin film formed with a transfer pattern,
wherein the transfer pattern includes a pattern which is formed in a predetermined region based on a design mask pattern, and
wherein the method comprises:
a step of irradiating inspection light to the predetermined region to obtain a first transmitted light quantity distribution;
a step of calculating, by simulation, a second transmitted light quantity distribution which should be obtained when the inspection light is irradiated to a thin film formed with a transfer pattern based on the design mask pattern;
a step of producing a predetermined-range difference distribution by plotting coordinates at which a difference light quantity value calculated from a comparison between the first transmitted light quantity distribution and the second transmitted light quantity distribution is not less than a first threshold value and less than a second threshold value; and a step of selecting the transfer mask in which a region with high density of plotting is not detected in the predetermined-range difference distribution.

3. The method according to claim 1, wherein the first threshold value is a lower limit of a difference light quantity value for use in judging the presence or absence of an internal defect of the transparent substrate, the presence or absence of a foreign matter defect adhering to a main surface, on a side opposite to a main surface where the thin film is formed, of the transparent substrate, or the presence or absence of a foreign matter defect adhering to a surface of a pellicle attached to the thin film.

4. The method according to claim 1, wherein the second threshold value is a lower limit of a difference light quantity value for use in judging the presence or absence of a defect due to the transfer pattern.

5. The method according to claim 1, wherein the step of selecting the transfer mask divides the predetermined-range difference distribution into a plurality of small regions, calculates a density of plotting in each small region, and compares the densities of plotting in the small regions to detect the region with high density of plotting.

6. The method according to claim 5, wherein the step of selecting the transfer mask judges that there is the region with high density of plotting when there is the small region in which the density of plotting is twice or more that in the other small region.

7. The method according to claim 1, wherein the step of selecting the transfer mask displays the predetermined-range difference distribution in image display means and detects by visual recognition the region with high density of plotting.

8. The method according to claim 1, wherein the inspection light has a wavelength of 200 nm or less.

9. The method according to claim 1, wherein the first threshold value is a difference light quantity value at which a transmittance difference calculated by dividing the difference light quantity value by a light quantity of the inspection light becomes 2%.

10. The method according to claim 1, wherein the second threshold value is a difference light quantity value at which a transmittance difference calculated by dividing the difference light quantity value by a light quantity of the inspection light becomes 40%.

11. The method according to claim 1, comprising carrying out overall correction of light quantity distribution for the first transmitted light quantity distribution or the second transmitted light quantity distribution and calculating the difference light quantity value using the corrected light quantity distribution.

12. A method of manufacturing a semiconductor device, comprising forming a circuit pattern on a semiconductor wafer using the transfer mask manufactured by the method according to claim 1.

13. The method according to claim 2, wherein the first threshold value is a lower limit of a difference light quantity value for use in judging the presence or absence of an internal defect of the transparent substrate, the presence or absence of a foreign matter defect adhering to a main surface, on a side opposite to a main surface where the thin film is formed, of the transparent substrate, or the presence or absence of a foreign matter defect adhering to a surface of a pellicle attached to the thin film.

14. The method according to claim 2, wherein the second threshold value is a lower limit of a difference light quantity value for use in judging the presence or absence of a defect due to the transfer pattern.

15. The method according to claim 2, wherein the step of selecting the transfer mask divides the predetermined-range difference distribution into a plurality of small regions, calculates a density of plotting in each small region, and compares the densities of plotting in the small regions to detect the region with high density of plotting.

16. The method according to claim 15, wherein the step of selecting the transfer mask judges that there is the region with high density of plotting when there is the small region in which the density of plotting is twice or more that in the other small region.

17. The method according to claim 2, wherein the step of selecting the transfer mask displays the predetermined-range difference distribution in image display means and detects by visual recognition the region with high density of plotting.

18. The method according to claim 2, wherein the inspection light has a wavelength of 200 nm or less.

19. The method according to claim 2, wherein the first threshold value is a difference light quantity value at which a transmittance difference calculated by dividing the difference light quantity value by a light quantity of the inspection light becomes 2%.

20. The method according to claim 2, wherein the second threshold value is a difference light quantity value at which a transmittance difference calculated by dividing the difference light quantity value by a light quantity of the inspection light becomes 40%.

21. The method according to claim 2, comprising carrying out overall correction of light quantity distribution for the first transmitted light quantity distribution or the second transmitted light quantity distribution and calculating the difference light quantity value using the corrected light quantity distribution.

22. A method of manufacturing a semiconductor device, comprising forming a circuit pattern on a semiconductor wafer using the transfer mask manufactured by the method according to claim 2.

* * * * *